(12) United States Patent
Chen et al.

(10) Patent No.: US 6,303,406 B1
(45) Date of Patent: Oct. 16, 2001

(54) METHOD FOR INTEGRATING ANTI-REFLECTION LAYER AND SALICIDE BLOCK

(75) Inventors: Chong-Yao Chen, Chang-Hua; Chen-Bin Lin, Taipei; Feng-Ming Liu, Feng-Shan, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/590,722

(22) Filed: Jun. 8, 2000

(51) Int. Cl.[7] .................................................... H01L 21/00
(52) U.S. Cl. ................ 438/72; 438/64; 438/69; 438/70; 438/636
(58) Field of Search .................. 438/64, 69, 70, 438/72, 636

(56) References Cited

U.S. PATENT DOCUMENTS

| | | | |
|---|---|---|---|
| 5,733,713 | * | 3/1998 | Yano et al. ............................ 430/316 |
| 6,171,885 | * | 1/2001 | Fan et al. ................................. 438/70 |
| 6,192,757 | * | 2/2001 | Tsang et al. ......................... 73/514.32 |
| 6,221,686 | * | 4/2001 | Drowley et al. ......................... 438/57 |

* cited by examiner

Primary Examiner—Jey Tsai
Assistant Examiner—Viktor Simkovic

(57) ABSTRACT

The present invention is a method for integrating an anti-reflection layer and a salicide block. The method comprises following steps: provide a substrate that is divided into at least a sensor area and a transistor area, wherein the sensor area comprises a doped region and the transistor area comprises a transistor that includes a gate, a source and a drain; forms a composite layer on the substrate, herein the composite layer at least also covers both sensor area and transistor area, and the composite layer increases refractive index of light that propagate from the doped region into the composite layer; performs an etching process and a photolithography process to remove part of the composite layer and to let top of the gate, the source and the drain are not covered by the composite layer; and performs a salicide process to let top of the gate, the source and the drain are covered by a silicate. One main characteristic of the invention is that the composite layer can be used as an anti-reflection layer of the sensor area and a salicide block of the transistor region. The composite layer is made of several basic layers and refractive index of any basic layer is different to refractive indexes of adjacent basic layers.

27 Claims, 9 Drawing Sheets

METHOD FOR INTEGRATING ANTI-REFLECTION LAYER AND SALICIDE BLOCK

BACKGROUND OF THE INVENTION

1. Field of the Invention

The proposed invention relates to a method for integrating anti-reflection layer and salicide block, and more particularly to a method for simplifying fabricating process of a photodetector device.

2. Description of the Prior Art

Because advancement of semiconductor technology and gradually increased requirement of high-integrated device, importance of device that includes several different functional elements is increased, such as the photodetector device that includes photodiode and transistor. However, because any specific functional element corresponds to a specific structure and a specific fabricating process, inconsistent difficulties is unavoidable during integration of different elements, especially when structure of any element is complex, such as complementary metal-oxide semiconductor. A popular solution of the difficulty is to divide the whole device into several independent parts and then forms each part separately. For instance, a chip is divided into several parts and when any specific part is formed photoresist is used to cover other parts. Obviously, unavoidable disadvantages of the method comprise prolonged cycle time and increased wastage of interactants.

In terms of photodetector device that usually used by digital camera and scanner, as the basic structural illustration shown in FIG. 1A, photodetector device is formed on substrate 10 and comprises sensor area 11 and transistor area 12. Herein, several isolations 102 locate on substrate 10, some doped regions 101 locate in sensor area and are separated to each other by some isolations 102, and there are transistors made of gates 121, sources 122, drains 123 and spacers 124 locate in transistor area. And silicide 125 locates on gates 121, sources 122 and drains 123. Beside, dielectric layer 13 locates on substrate 10 and covers all forementioned structures, interconnects 14 locates on dielectric layer 13 and further connecting with transistors, covering layer 15 locates on dielectric layer 13 and totally covers interconnects 14, and color filter 16 locates on covering layer 15 and over doped regions 101. Further, because that color filter 16 is used to let only some specific light propagate to specific doped regions 101, not only at least one color filter locates over anyone of doped regions 101, but also no lighttight structure, such as interconnects 14 locates between a doped region 101 and corresponding color filter 16.

However, in sensor area 11, because that light propagates through color filters 16 to doped regions 101 will be partly reflected and also owing to the truth that light does not always vertically propagate to doped regions 101, reflected light will be distributed in all directions. Significantly, as reflected light is reflected by lighttight interconnects 14, it is possible that any doped region 101 is interfered by other doped regions 101 and then crosstalk phenomena is happened. It means that any doped region 101 can not distinguish received light is the light propagated from corresponding color filter 16 or the light propagated from neighboring interconnects 14 which only is noise. Therefore, as FIG. 1B shows, to make sure any doped region 101 is not interfered by light that is reflect by other doped regions 101, it is necessary to form anti-reflection layer 17 on all doped regions 101 before dielectric layer 13 is formed. As usual, available materials of anti-reflection layer 17 are TiN, Ti or TiW.

On the other hand, in transistor area 12, importance of silicide 125 is increased as critical scale is decreased, but it is not desired to cover total transistor area 12 by silicide 125. That is to say, it is necessary to form salicide block 18 on substrate 10 and cover forbidden region of transistor area 12 before silicide 125 is formed, as FIG. 1B shows, where forbidden region is the region that silicide 125 is needless. In general, material of salicide block 18 will not react with metal for forming silicide 25, and available materials comprise tetraethyl-orthosilicate (TEOS).

According to previous discussion, it is natural that because material of anti-reflection layer 17 is different to material of salicide block 18, though doped regions 101 and isolations 102 of both areas can be formed together to simplify the fabricating process of photodetector device, but following processes of different areas can not be formed at the same time until silicide 125 is formed. However, referring to FIG. 1B, due to the structural difference of the two areas, some processes for constructing these different structures are always incompatible, such as process for forming gate 121, process for forming silicide 125 and process for forming color filter 16. But due to location of anti-reflection layer is similar to location of salicide block 18, it is possible to integrate process for forming anti-reflection layer 17 and process for forming salicide block 18. Thus, how to overcome current difficulties to properly integrate these processes is an important field of fabrication processes of photodetector device.

SUMMARY OF THE INVENTION

A principal object of the present invention is to provide a method for integrating fabricating processes of anti-reflection layer and fabricating processes of salicide block.

Another object of the present invention is to provide a method for forming both anti-reflection layer and salicide block at the same time.

A further object of the present invention is to provide a method that anti-reflection layer and salicide block are made of identical materials.

Still an object of the invention is to provide a manufacturable and practical method for forming both anti-reflection layer and salicide block.

Objects of the invention further includes a method for forming photodetector device, where anti-reflection layer for preventing crosstalk phenomena and salicide block for making sure location of silicde are formed together to simplify fabricating process and improve efficiency.

In short, a preferred embodiment is a method comprises: provide a substrate that is divided into at least a sensor area and a transistor area, wherein the sensor area comprises a doped region and the transistor area comprises a transistor that includes a gate, a source and a drain; forms a composite layer on the substrate, herein the composite layer at least also covers both sensor area and transistor area, and the composite layer increases refractive index of light that propagate from the doped region into the composite layer; performs an etching process and a photolithography process to remove part of the composite layer and to let top of the gate, the source and the drain are not covered by the composite layer; and performs a salicide process to let top of the gate, the source and the drain are covered by a silicate.

Further, when the embodiment is applied to form a photodetector device, following steps are included: removes some leftover interacts of the salicide process; forms a first dielectric layer on both composite layer and silicide layer; forms some interconnects on first dielectric layer, wherein interconnects locate over both transistors and isolations; forms a second dielectric layer on the first dielectric layer, herein second dielectric layer also covers interconnects; and forms some color filters on the second dielectric layer, herein color filters locates over these doped regions.

Obviously, one main characteristic of the invention is that the composite layer is used as an anti-reflection layer of the sensor area and a salicide block of the transistor region at the same time. Thus, after doped regions and transistors are all formed, it is possible to integrate fabricating processes of anti-reflection layer and fabricating processes of salicide block. Further, the composite layer is made of several alternate overlapped basic layers and refractive index of any basic layer is different to refractive indexes of adjacent basic layers.

BRIEF DESCRIPTION OF THE DRAWINGS

In the accompanying drawing forming a material part of this description, there is shown.

DESCRIPTION OF THE PREFERRED EMBODIMENT

First of all, the inventor points out that function of salicide block is to prevent metal for forming silicde adheres on forbidden region of substrate where silicide is unexpected, and then dielectric is available material of salicide block. In contrast, function of anti-reflection layer is to minimized refractive intensity of light that propagates to substrate, then available condition of materials of anti-reflection layer should be focused on the refractive ratio of light that propagates from substrate into anti-reflection layer.

Next, the inventor points out a clew about the unsolved issue: because that conventional material of salicide block is dielectric which is a photic material with a refractive index, and also because one basic optical principle that total reflection will be happen when light is propagated from low refractive index material into high refractive index material, it is reasonable that whenever a composite layer is made of several multifold different dielectric layer, the composite layer can totally reflect light that propagates in specific directions. In other words, the composite layer can be used as an anti-reflection layer, even each dielectric layer is photic.

Accordingly, the inventor points out that forms a composite layer by several multifold dielectric layers is a possible method to form a layer with the function of total reflection, and then same materials, dielectric, can be used to form both salicide block and anti-reflection layer at the same time. Thus, the method is an effective method to integrate fabricating processes of anti-reflection layer and fabricating processes of salicide block.

Following, a preferred embodiment of the invention, a method for integrating salicide block and anti-reflection layer, is present to display contents of the invnetion.

Figure 2A:
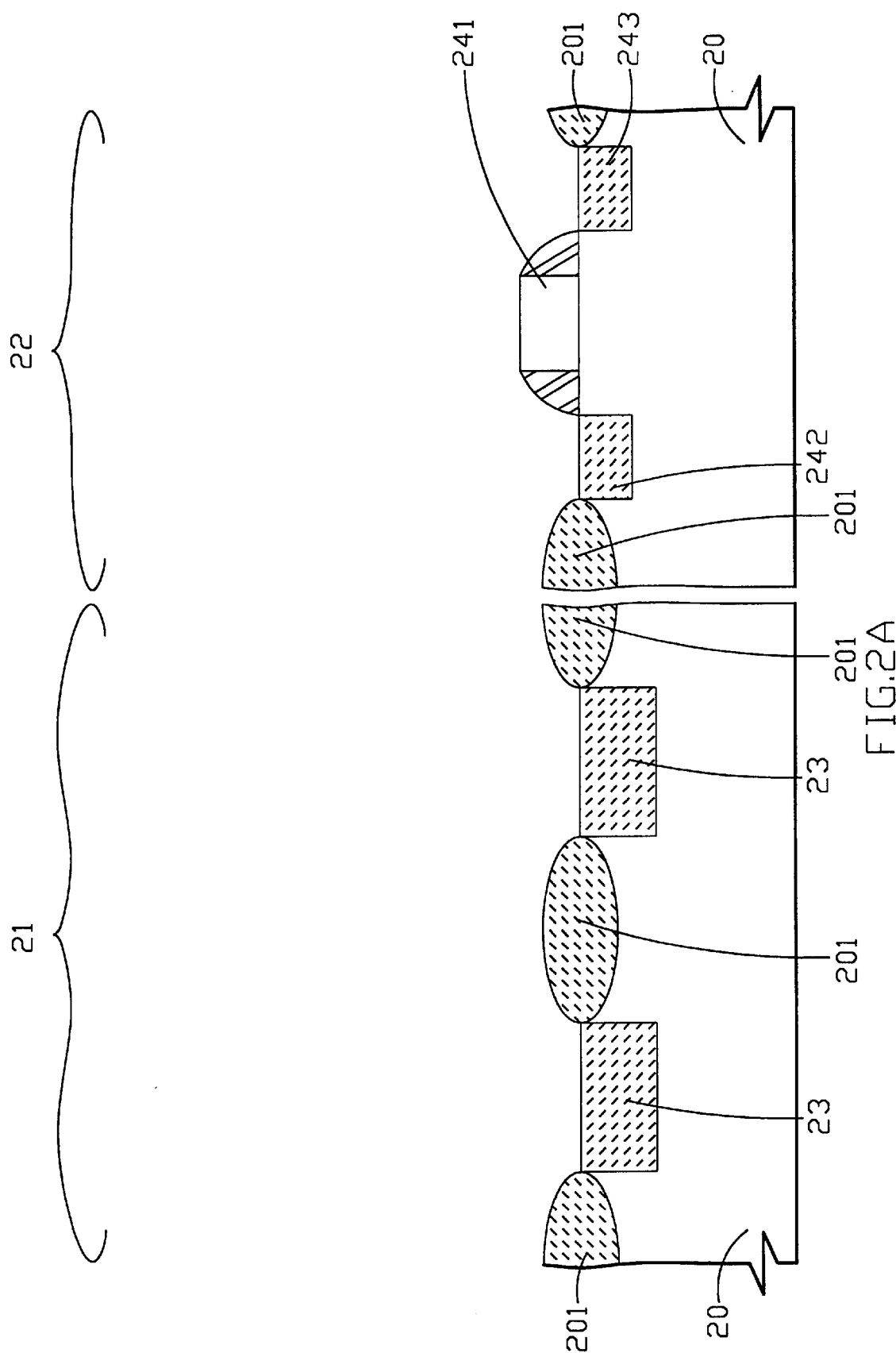
FIG. 2A to FIG. 2G are a series of qualitative cross-section illustration about essential steps of one preferred embodiment of the invention.

As FIG. 2A shows, provides substrate 20 that can be divided into at least sensor area 21 and transistor area 22, where sensor area 21 comprises doped regions 23 and transistor area 22 comprises transistors that include gates 214, sources 242, drains 243 and spacers 244. Moreover, sensor area 21 and transistor area 22 is separated by isolations 201.

Figure 2B:
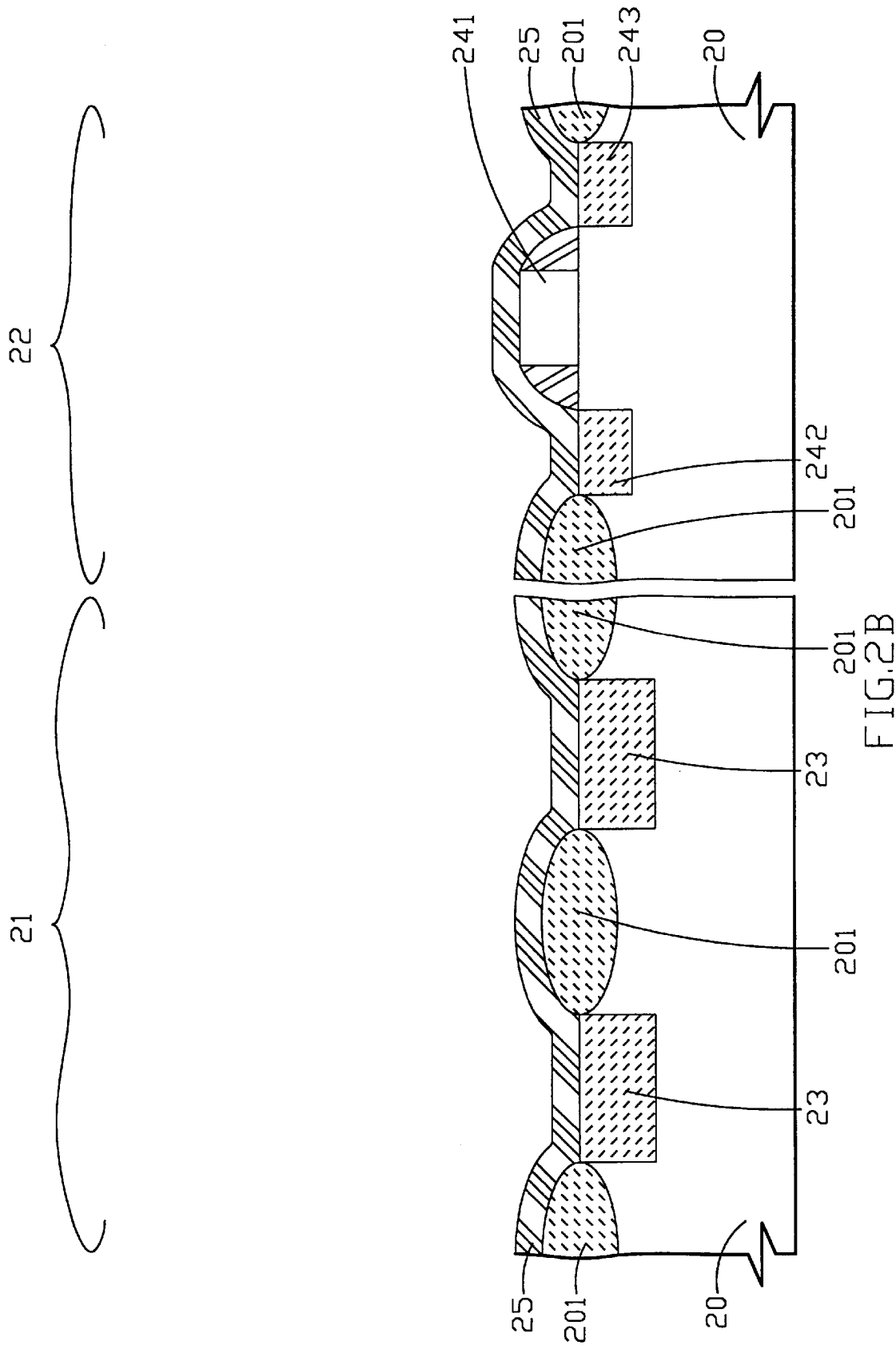

As FIG. 2B shows, forms composite layer 25 on substrate 20, herein doped regions 23 and transistors also are covered by composite layer. Where, composite layer 25 functions to increase refractive index of light that propagates from doped regions 23 into composite layer 25.

It should be noted that composite layer 25 comprises several basic layers which are alternate overlapped, and refractive index of any specific basic layer is different from refractive index of adjacent basic layers. Because that total reflection will happen when light propagate from high refractive index material into low refractive index material but total reflection will not happen when light propagate from low refractive index material into high refractive index material, it is possible to totally reflect light that propagates from doped regions 23 into composite layer 25, at least substantially increase the reflective ratio, by properly adjust relative factors, such as refractive index and thickness, of these basic layers. In this way, even materials of composite layer 25 are photic but composite layer 25 also can be used as an anti-reflection layer. Certainly, refractive index and thickness of all basic layers should be adjusted in according to practical configuration, but a general rule is that refractive index of any specific basic layer is proportional to the distance between doped regions 23 and the specific basic layer.

In general, available materials of composite layer 25 comprise plasma enhanced tetraethyl-orthosilicate, plasma enhanced silicon nitride and other photic dielectric. Further, to match the requirement of salicide block of transistor region 22, composite layer 25 usually is made of several plasma enhanced tetraethyl-orthosilicate layers and several plasma enhanced silicon nitride layers, and plasma enhanced tetraethyl-orthosilicate layers and plasma enhanced silicon nitride layers are alternate overlapped. Herein, plasma enhanced tetraethyl-orthosilicate layers are formed by a plasma enhanced chemical deposition process and plasma enhanced silicon nitride layers also are formed by a plasma enhanced chemical deposition process. Beside, thickness of said composite layer is about 500 angstroms.

Figure 2C:
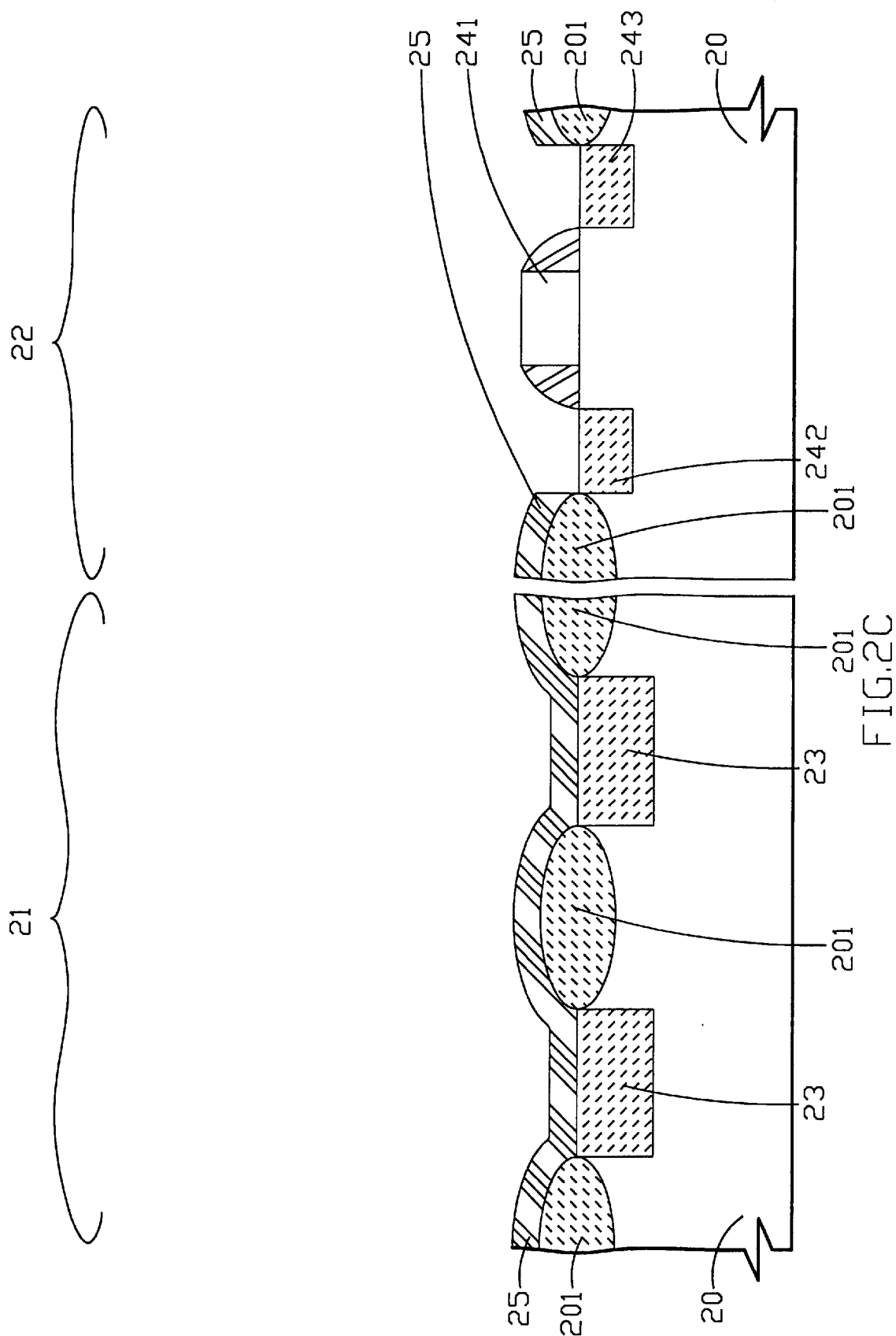

As FIG. 2C shows, perform a photolithography process and an etching process to remove part of composite layer 25 and to let tops of gates 241, sources 242 and drains 243 are not covered by composite layer 25. Herein, material of tops of gates 241 is polysilicon.

Figure 2D:
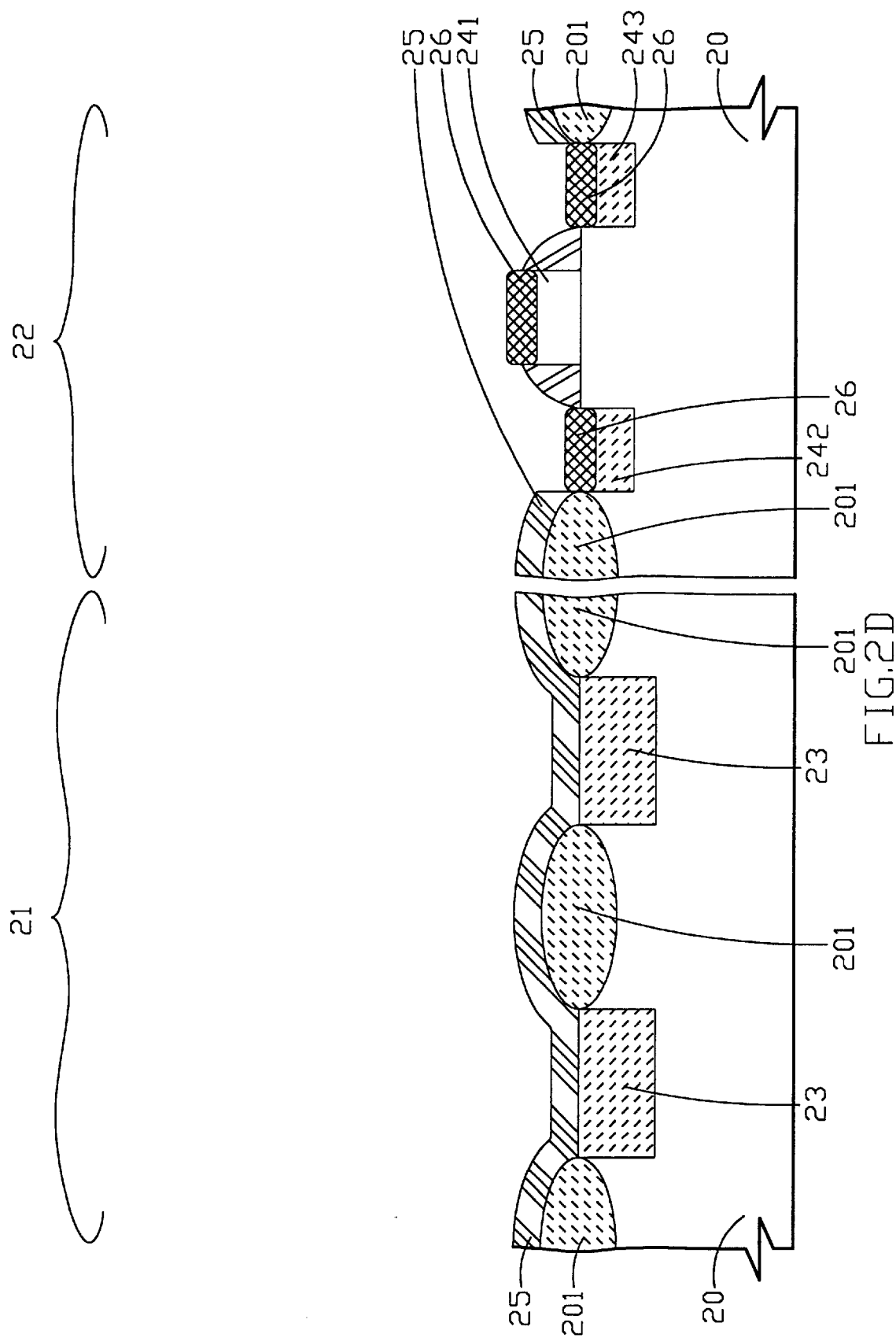

As FIG. 2D shows, performing a salicide process to form silicide 26 on tops of gates 241, sources 242 and drains 243. It should be noted that material of composite layer 25 is equal to conventional material of salicide block, and then no harmful side effect will be happened when composite layer 25 is used as salicide block.

Significantly, according to previous discussion, composite layer 25 plays as salicide block when silicide 26 is formed in transistor area 22; composite also plays as anti-reflection layer in sensor area 21. Therefore, the present invention is a method that properly integrates fabricating processes of anti-reflection layer and fabricating processes of salicide block. Beside, because that fabricating processes of composite layer 25 only includes processes for forming some dielectric layers, the invention also is a manufacturable and practical method.

Figure 2E:
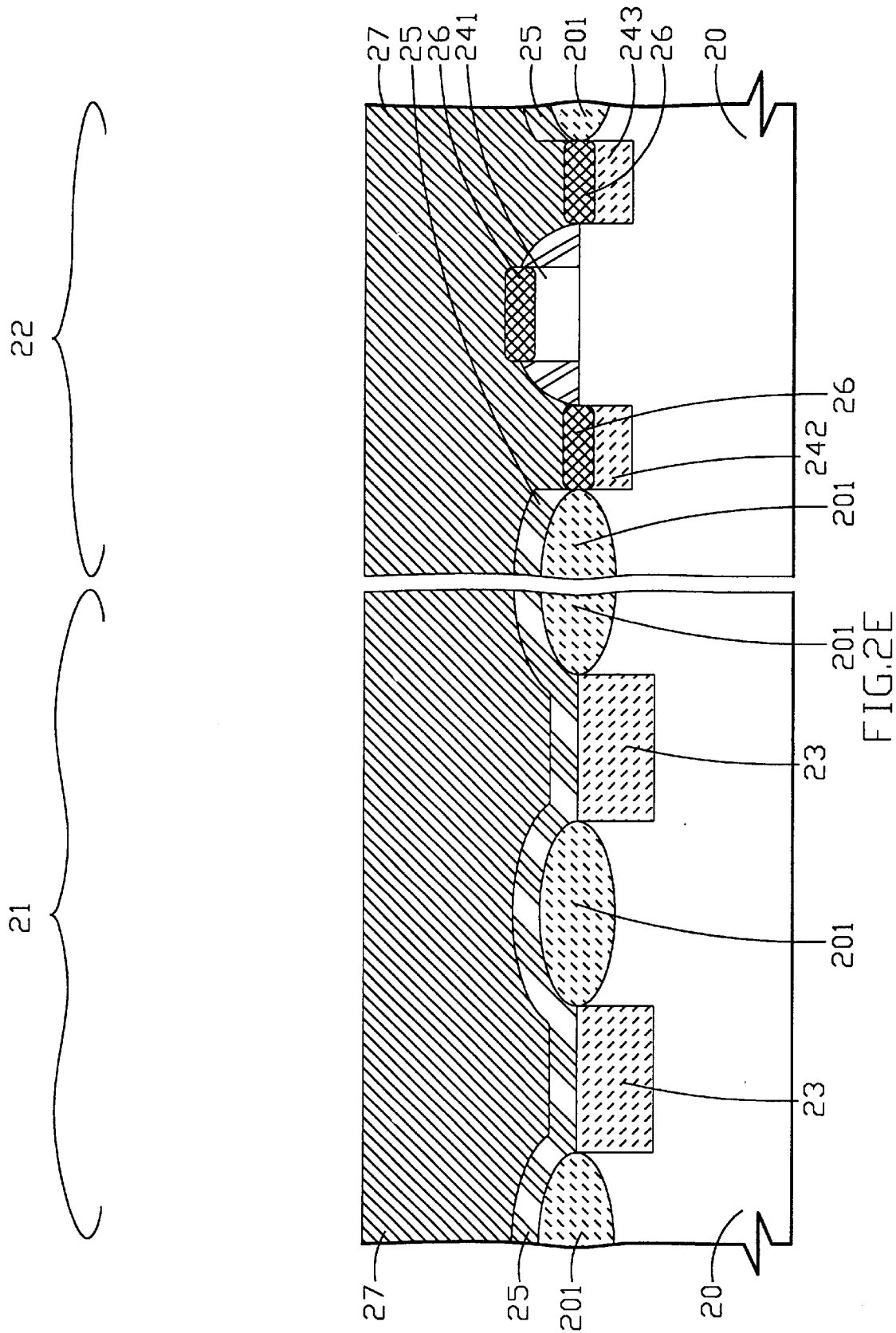
Figure 2F:
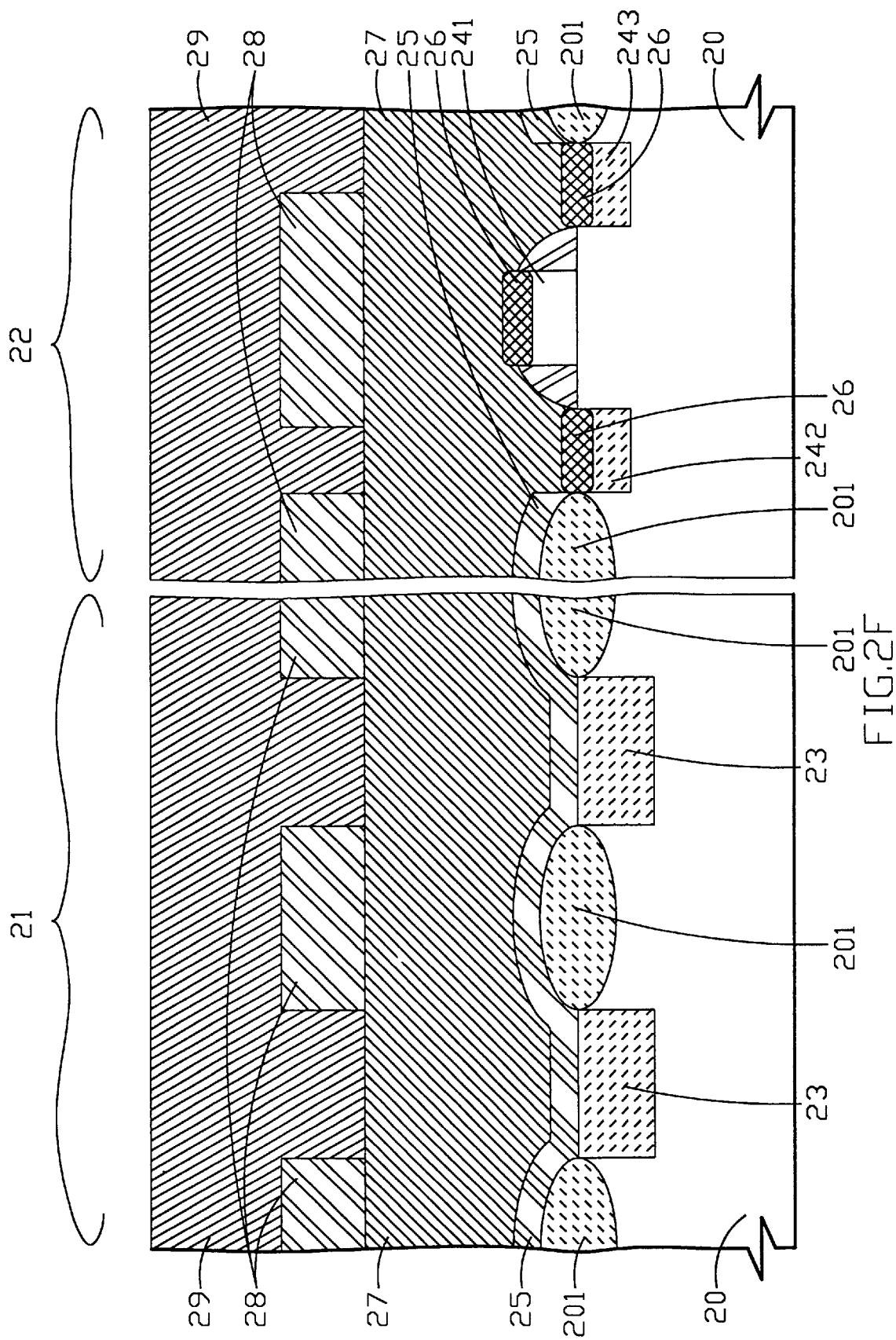
Figure 2G:
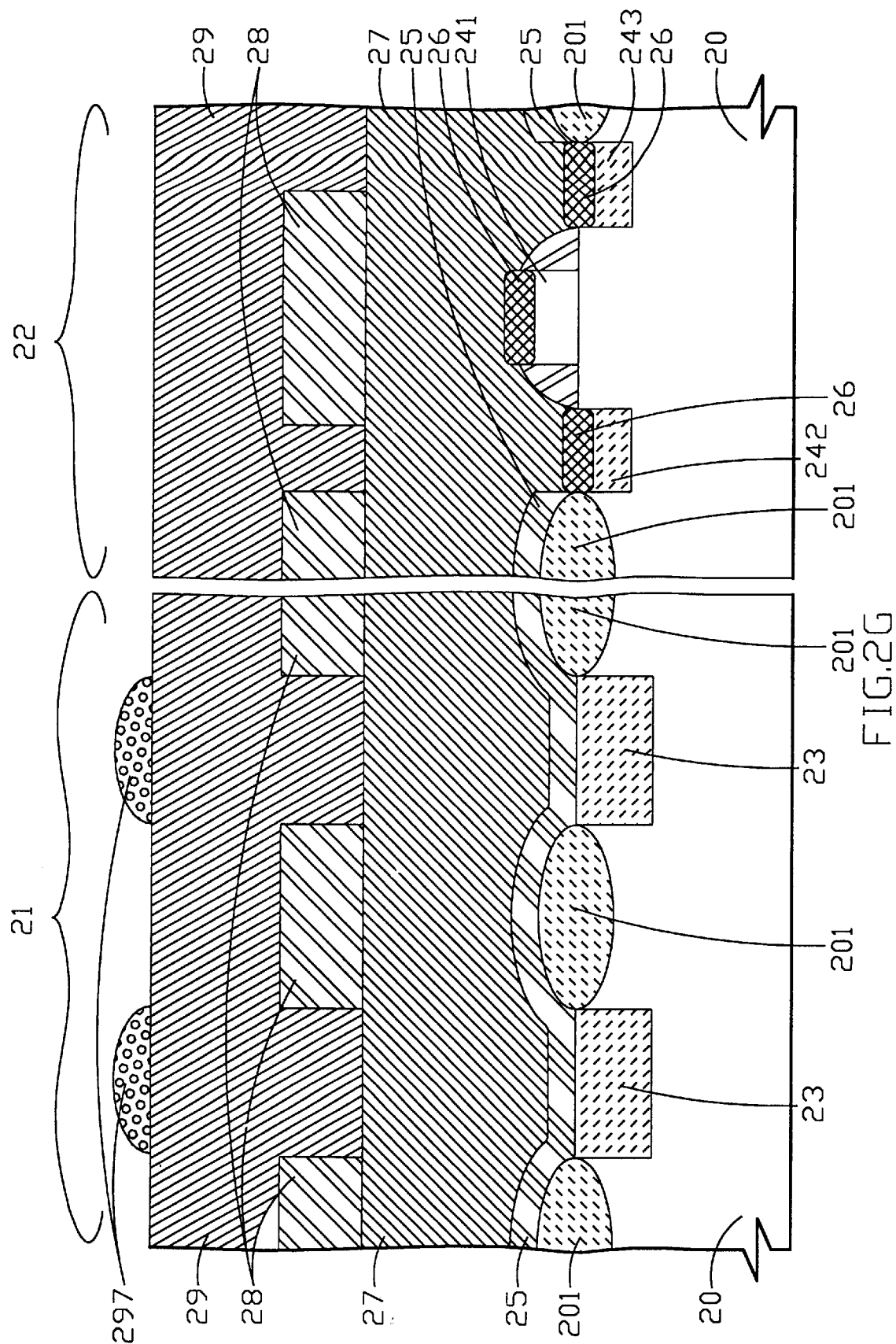

Further, when the embodiment is applied to practical case that forms a photodetector device, as shown in FIG. 2E to FIG. 2G, following steps are included:

As FIG. 2E shows, removes some leftover interacts of the salicide process and then forms first dielectric layer 27 on both composite layer 25 and silicide layer 26.

As FIG. 2F shows, forms some interconnects 28 on first dielectric layer 27 and then forms second dielectric layer 29 on first dielectric layer 27. Wherein interconnects 28 locate over both transistors and isolations 201 and second dielectric layer 29 also covers interconnects 28. Further, interconnects 28 usually are connected with transistors and also usually are coupled with doped regions 23.

As FIG. 2G shows, and forms some color filters 295 on second dielectric layer 29, herein color filters 295 locates over doped regions 23. Beside, available varieties of said color filters comprise red light color filter, blue light color filter and green light color filter. And as usual, at least one color filter 295 locates over one said doped region 23.

Incidentally, owing to the increased complexity of current semiconductor devices, substrate 20 further comprises numerous resistors (not shown in figures) that are covered by composite layer 25. In general, these resistors usually are some polysilicon structures on 21 isolations, and these polysilicon structures and tops of gates 241 of transistors are formed at the same time. Beside, these resistors usually are coupled with transistors.

Figure 1A:
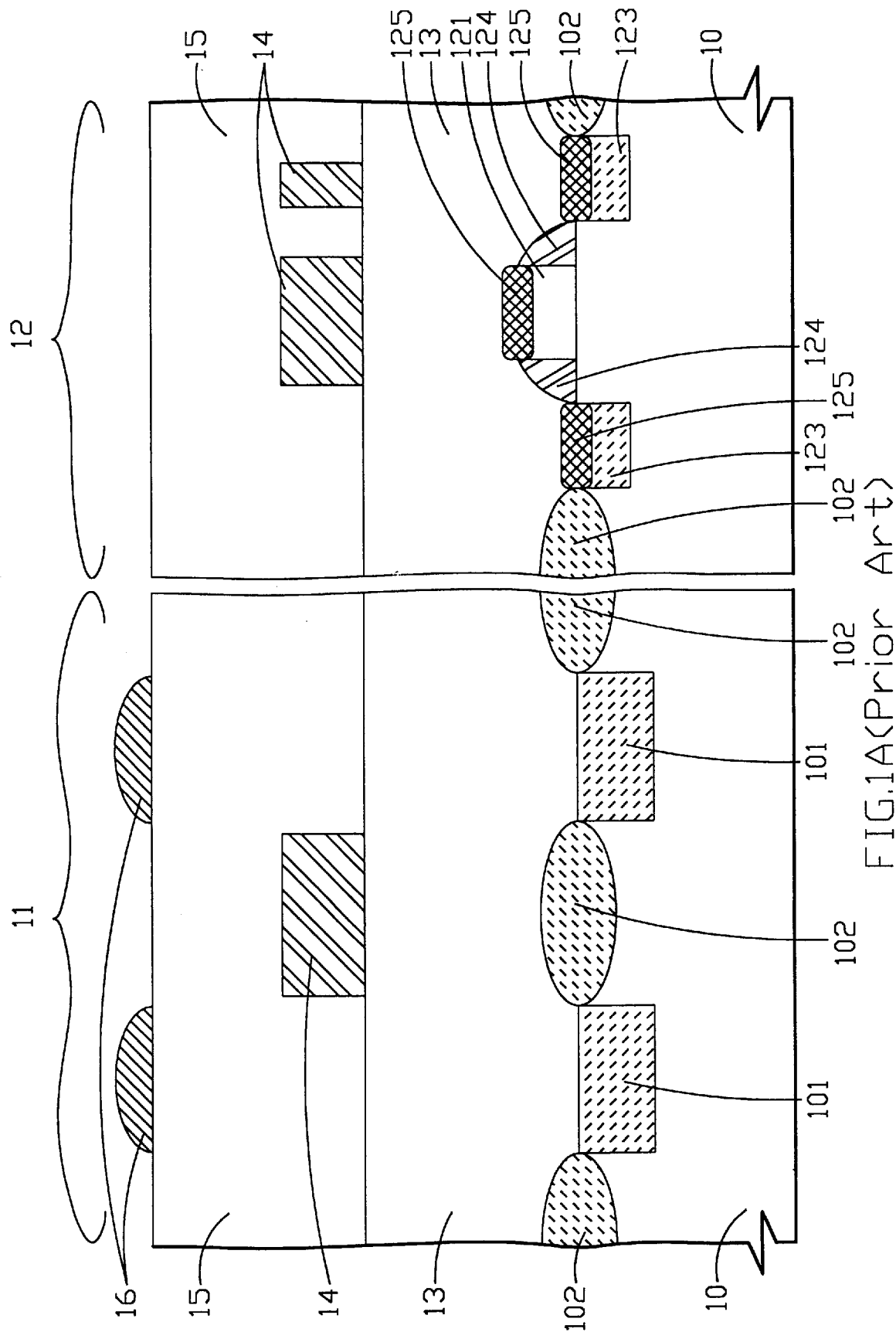
FIG. 1A and FIG. 1B are brief illustrations for explain location and function of both anti-reflection layer and salicide block.
Figure 1B:
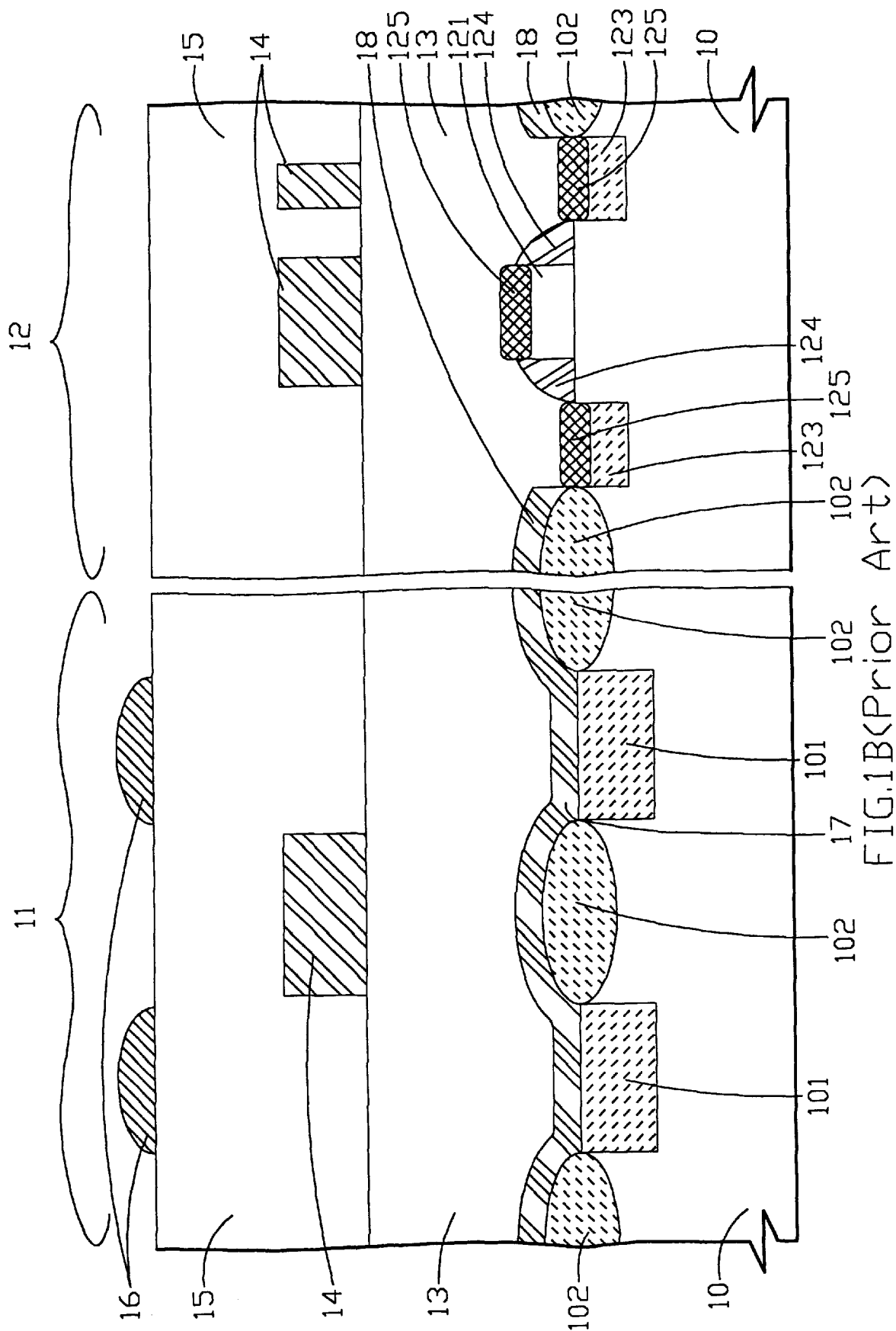

By comparing FIG. 2G and FIG. 1B, it is crystal-clear that composite layer 25 efficiently behaves as anti-reflection layer, and then interconnects 28 almost can not let any specific doped region 23 receive light that propagated from other doped regions 23. In other words, the invention can efficiently prevent crosstalk phenomena and then is a suitable method for forming photodetector device.

Although specific embodiment has been illustrated and described, it will be obvious to those skilled in the art that various modifications may be made without departing from what is intended to be limited solely by the appended claims.

What is claimed is:

1. A method for integrating an anti-reflection layer and a salicide block, said method comprising following steps:
   providing a substrate, said substrate being divided into at least a sensor area and a transistor area, wherein said sensor area comprises a doped region and said transistor area comprises a transistor that includes a gate, a source and a drain;
   forming a composite layer on said substrate, herein said composite layer at least also covers both said sensor area and said transistor area, herein said composite layer increases reflective ratio of light that propagates from said doped region into said composite layer;
   performing both a photolithography process and an etching process to remove part of said composite layer and to let top of said gate, said source and said drain be not covered by said composite layer; and
   performing a salicide process to let top of said gate, said source and said drain be covered by a silicate.

2. The method according to claim 1, wherein said sensor area and said transistor area is separated by an isolation.

3. The method according to claim 1, wherein material of top of said transistor is polysilicon.

4. The method according to claim 1, wherein said composite layer comprises several basic layers which are alternately overlapped.

5. The method according to claim 4, wherein refractive index of each said basic layer is different from refractive index of the adjacent basic layers.

6. The method according to claim 4, wherein refractive index of each said basic layer is greater than refractive index of the basic layer that positions farther from said doped region.

7. The method according to claim 1, wherein available materials of said composite layer comprise plasma enhanced tetraethyl-orthosilicate and plasma enhanced silicon nitride.

8. The method according to claim 1, wherein said composite layer is made of a plurality of plasma enhanced tetraethyl-orthosilicate layers and a plurality of plasma enhanced silicon nitride layers.

9. The method according to claim 8, wherein said plasma enhanced silicon nitride layers are formed by a plasma enhanced chemical deposition process.

10. The method according to claim 1, wherein thickness of said composite layer is about 500 angstroms.

11. A method for forming a photodetector device, comprising
   providing a substrate, said substrate comprising a plurality of doped regions, a plurality of transistors and a plurality of isolations;
   forming a composite layer on said substrate, said composite layer also covering said doped regions, said transistors and said isolations, wherein said composite layer is used to increase refractive index of light that propagate from said doped regions into said composite layer;
   performing both a photolithography process and an etching process to remove part of said composite layer and to define a salicide area that comprises a plurality of tops of gates, a plurality of sources and a plurality of drains;
   performing a salicide process to form a silicide layer on said salicide area;
   removing a plurality of leftover interacts of said salicide process;
   forming a first dielectric layer on both said composite layer and said silicide layer;
   forming a plurality of interconnects on said first dielectric layer, wherein said interconnects locate over both said transistors and said isolations;
   forming a second dielectric layer on said first dielectric layer, herein said second dielectric layer also covers said interconnects; and
   forming a plurality of color filter on said second dielectric layer, said color filters locating over said doped regions.

12. The method according to claim 11, wherein said substrate further comprises a plurality of resistors.

13. The method according to claim 12, wherein said resistors are a plurality of polysilicon structures on said isolations.

14. The method according to claim 13, wherein said polysilicon structures and tops of gates of said transistors are formed at the same time.

15. The method according to claim 11, wherein said resistors are coupled with said transistors.

16. The method according claim 11, wherein said composite layer covers said resistors.

17. The method according to claim 11, wherein said composite layer comprises several basic layers.

18. The method according to claim 17, wherein refractive index of any specific said basic layer is different from refractive index of adjacent basic layers.

19. The method according to claim 17, wherein the refractive index of each specific said basic layer is greater than the refractive index of the basic layer directly underneath it.

20. The method according to claim 11, wherein available materials of said composite layer comprise plasma enhanced tetraethyl-orthosilicate and plasma enhanced silicon nitride.

21. The method according to claim 11, wherein said composite layer is made of both a plurality of plasma enhanced tetraethyl-orthosilicate layers and a plurality of plasma enhanced silicon nitride layers.

22. The method according to claim 21, wherein said plasma enhanced silicon nitride layers are formed by a plasma enhanced chemical deposition process.

23. The method according to claim 11, wherein thickness of said composite layer is about 500 angstroms.

24. The method according to claim 11, wherein said interconnects connects with said transistors.

25. The method according to claim 11, wherein said interconnects are coupled with said doped regions.

26. The method according to claim 11, wherein available varieties of said color filters comprise red light color filter, blue light color filter and green light color filter.

27. The method according to claim 11, wherein at least one said color filters locates over any one of said doped regions.

* * * * *